Sept. 1, 1964 N. M. HOCHSTETLER 3,147,402

PRINTED CIRCUIT MODULE WITH HINGED CIRCUIT PANEL

Filed Nov. 10, 1960 2 Sheets-Sheet 1

INVENTOR.
NEVIN M. HOCHSTETLER

BY Roger W. Jensen
ATTORNEY

Sept. 1, 1964 N. M. HOCHSTETLER 3,147,402

PRINTED CIRCUIT MODULE WITH HINGED CIRCUIT PANEL

Filed Nov. 10, 1960 2 Sheets-Sheet 2

*INVENTOR.*
NEVIN M. HOCHSTETLER
BY Roger W. Jensen
ATTORNEY

United States Patent Office 3,147,402

Patented Sept. 1, 1964

3,147,402
PRINTED CIRCUIT MODULE WITH HINGED CIRCUIT PANEL

Nevin M. Hochstetler, Clearwater, Fla., assignor to Minneapolis-Honeywell Regulator Company, Minneapolis, Minn., a corporation of Delaware Filed Nov. 10, 1960, Ser. No. 68,407
5 Claims. (Cl. 317—100)

This invention relates to electronics apparatus and more particularly to an electronic module which features high resistance to destructive vibration, means for dissipating the heat developed by components in the module, compact distribution of the components, and ease of repair and servicing.

Most present day printed circuit module manufacturers are plagued by troubles trying to meet vibration requirements, heat dissipation requirements, while still producing compact modules which are easy to service. If the modules are made compact they are usually hard to service and it is hard to dissipate the heat; if they are designed to dissipate heat, quite often they may have vibration troubles and are bulky and accordingly objectionable.

The present invention is an electronic module with at least one printed circuit board which is mechanically connected to a metal or other heat conducting frame. The frame is channeled or grooved in such fashion as to coact with suitable tongue or tongues on a main chassis or mounting means. The metal frame produces a much more rugged and rigid module which is less susceptible to vibration problems than previous unsupported modules. The heat conducting frame to which the printed circuit boards are mechanically attached allows good distribution of the heat conducted to the boards by the individual components on the boards, since the board is in good heat conducting relation to the frame. The heat conducting frame which can be machined to close tolerances can then easily dissipate the heat through conduction to the main chassis. This method of heat dissipation is significantly more efficient that the prior art where the heat had to be transferred from the printed circuit card through two small, loosely-fitting slots.

It therefore follows, since the present invention dissipates more heat in the same amount of printed circuit board area, that more heat dissipating components can be placed upon this board and the present invention therefore offers a more compact arrangement of heat producing components than previously possible.

Another feature of this invention is a hinged relation of one or more of the boards to the frame. This hinged mounting of the board increases the ease of repair and servicing. In some instances, modules can even be serviced while plugged into the main chassis since all the electrical wiring remains intact even when the board is open. This feature gives the present invention another big step over prior art, since it was quite frequent that the electronic module would seem to perform satisfactorily in the test jig and yet not give the required performance when interconnected to the system.

General and specific objects of the invention, including constructional details will become apparent from the reading of the following specification and appended claims, and in conjunction with the accompanying drawings of which:

Figure 1:
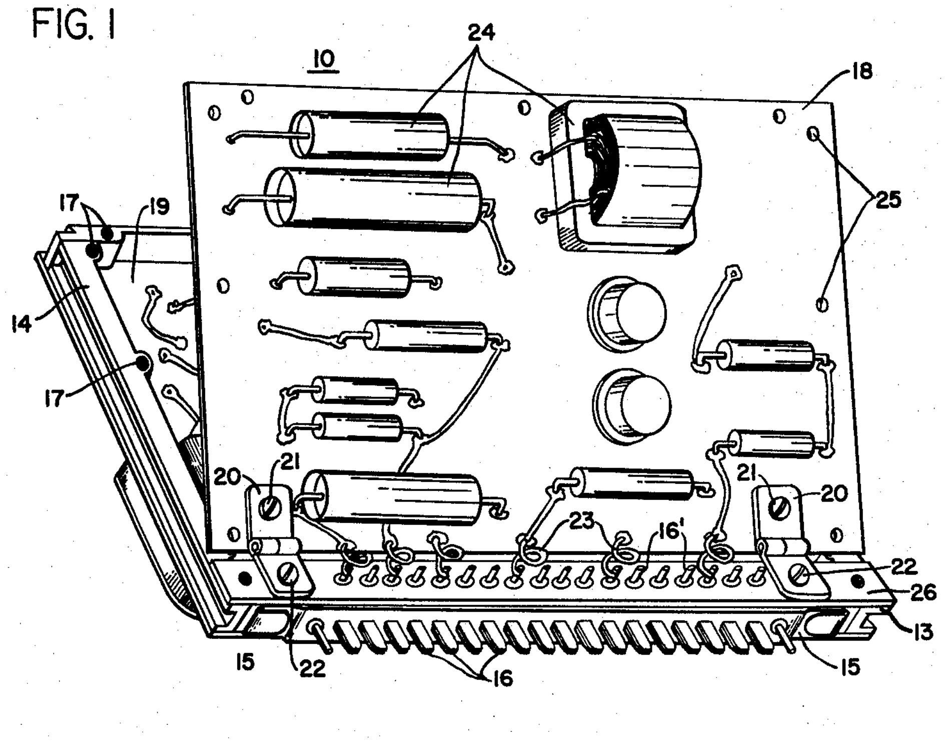
FIGURE 1 is an isometric view of a module with one of the printed circuit boards partially opened upon its hinges.

In FIGURE 1 the reference number 10 generally depicts an electronic module.

Figure 5:
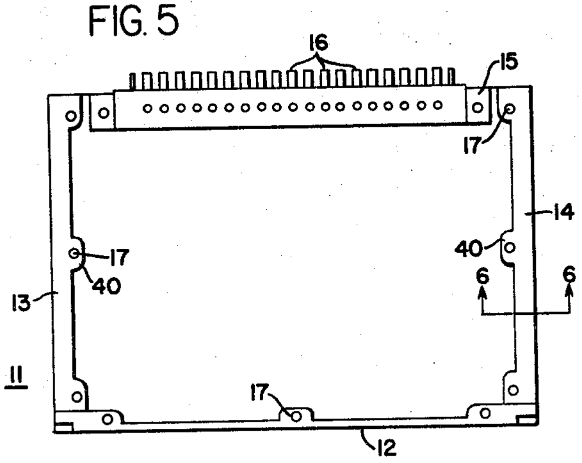
FIGURE 5 is a representation of the module with one printed circuit board removed to show the construction of the frame and the placement of the electrical connector.

Referring to FIGURE 5, the basic framework of the electronic module 10 is shown. Module 10 comprises in part the generally U-shaped heat conducting frame member 11 having a bight portion 12 and a pair of leg members 13 and 14. If desired, members 12, 13 and 14 may be integral with one another, or, as shown, they may be separate structural members suitably connected together. The leg members 13 and 14 each having one end thereof abutted against the inner portion of the bight portion 12.

The module 10 also includes an elongated electrical connector 15 having a plurality of separate conductive prongs 16, which also protrude on both sides of the connector 15 at 16'. The connector 15 is adapted to be generally positioned between the other ends of the leg members 13 and 14 so that the frame member 11 in combination with the connector 15 forms substantially a rectangular shaped unit.

Referring next to FIGURE 1 the electronic module 10 comprises in part two printed circuit boards 18 and 19. The boards 18 and 19 are held firmly in place on the electronic module 10 by a connecting means 27, which is discussed later and is inserted in holes 17 in the frame member 11. FIGURE 1 depicts electronic module 10 with hinged board 18 and a permanently fastened board 19. As can easily be seen, both boards 18 and 19 could be hinged if so desired. A hinge means 20 connects the electronic module 10 and the board 18 by the use of mechanical connecting means 21 and 22. The electrical connector 15 and the board 18 are electrically connected by electrical means or pigtail means 23 which are attached on one end to the prongs 16' and to printed circuitry on the board 18 at the other end. The board 18 has various electrical components generally designated as 24. The board 18 has holes 25 to provide part of the means to mechanically connect the board 18 to the frame 11. A strip of material 26 generally positions the electrical connector means 15 in a more secure mechanical relation to the other end of the frame members 13 and 14 and although this is not needed, it provides a more rigid module 10.

Figure 2:
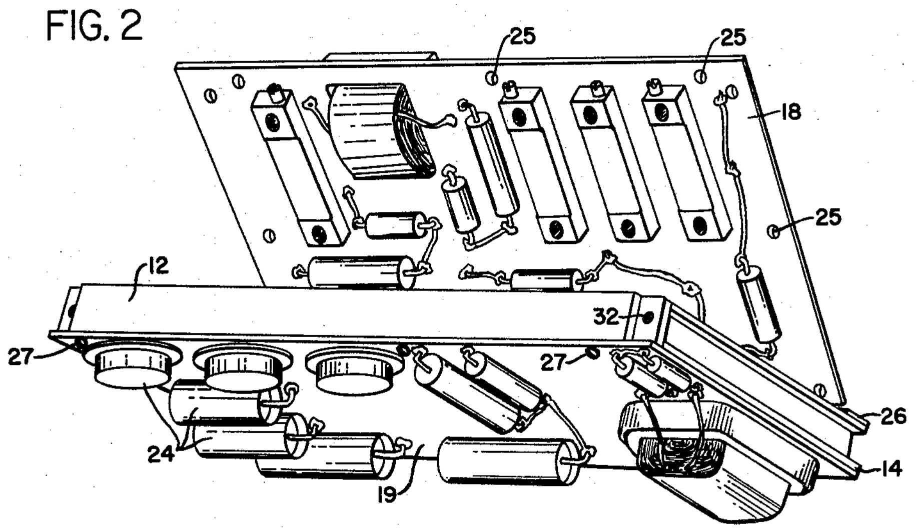
FIGURE 2 is another isometric view viewed from the opposite side thereof.

FIGURE 2 shows generally the same parts of the module 10 as FIG. 1 does but gives a different isometric view. A screw means 27 is also shown in FIGURE 2 which is the means to connect the printed circuit boards 18 and 19 to the frame member 11. Although a screw means is used here, other securing means could be used.

Figure 3:
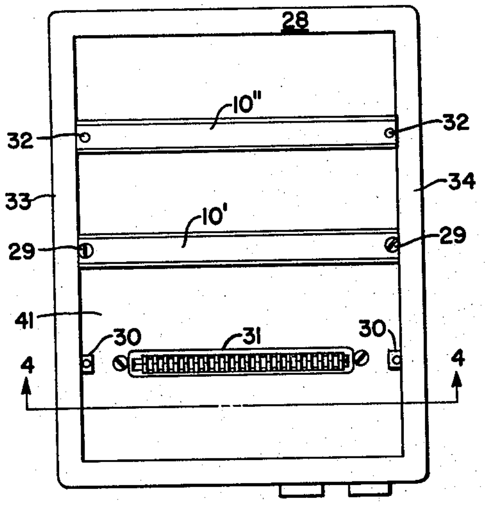
FIGURE 3 is the top view of a main chassis constructed to receive three electronic modules of which two are shown. In this view the middle space contains a module which is firmly attached to the main chassis while the other module is only placed part way into position.
Figure 4:
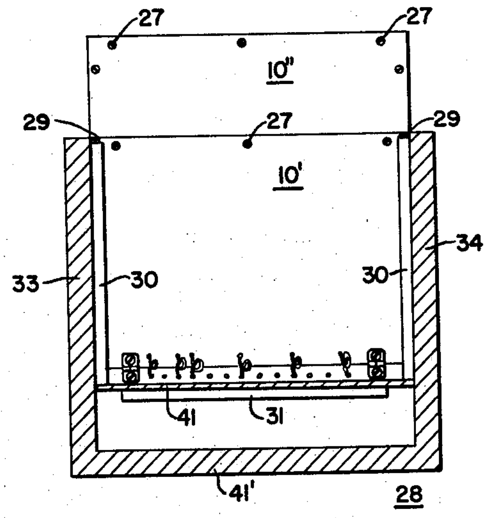
FIGURE 4 is a cross-sectional view of the chassis of FIGURE 3 as viewed along section lines 4—4 thereof.

A chassis 28 for receiving modules is depicted in FIGURES 3 and 4. This chassis 28 comprises first and second side portions 33 and 34 respectively and a base portion 41' together with a false bottom 41'. The chassis is not limited to a plurality of base portions but may only have one base portion such as 41 or 41'. A plurality of tongue means or rail portions designated as 30 are mounted on the sides of the chassis 33 and 34. The tongue 30 is designed to coact with the side members of the module 10 which are generally referred to as 13 and 14. The false bottom 41 contains several second electrical connecting means 31, one of which is shown.

Figure 6:
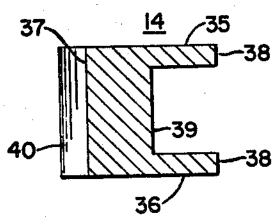
FIGURE 6 is a cross-sectional view of one of the side members of the frame shown in FIGURE 5 at the point of section lines 6—6.

FIGURE 6 is a cross-sectional view of leg member 14 of the module 10 shown in FIGURE 5. The leg portion 14 has first and second sides 35 and 36 respectively and inner and outer edges 37 and 38 respectively. The leg portion 14 also has a grooved channel 39 on the outer edge of the leg. The leg portion 14 is shown with an extension 40 which is used to provide enough metal for the holes 17 to thereby secure the boards 18 and 19 to the frame portion 11 of the module 10. The channel 39 on leg portion 14 engages the tongue 30 when the module 10 is inserted in the chassis 28.

FIGURES 3 and 4 also depict a pair of modules 10' and 10'' positioned in the chassis 28. The module 10' is fully inserted in the chassis 28 and held in place by mechanical securing means 29. The module 10'' as depicted is only inserted part way into the chassis 28. The modules are inserted in the chassis 28 in a sliding relation with the channel portions 39 engaging the tongue or rail portions 30 and upon full insertion, the prongs 16 of the first electrical connector 15 are inserted into the receiving end of the second electrical connector means 31 which is mechanically secured to the false bottom 41 of the chassis 28. The mechanical securing means 29 is inserted through a hole 32 in the electronic module 10 and mechanically secures the module 10 to the tongue 30.

When a module is used, it can easily be seen that the hinged board on the module will provide an easy access to the underside of not only the hinged but also the permanently mounted board. Repair or replacement of components on the underside of the boards or for the purpose of repairing the printed circuitry under the board or even just obtaining access to the underside of the boards to check voltages etc. throughout the circuit is facilitated by the hinged arrangement. When the two boards are secured to the frame, a good heat transfer path is supplied from the components through the board and the frame to the housing of the chassis in which the module is inserted. This enables the components on the board to dissipate a large amount of heat without auxiliary cooling means such as fans or some other means of producing forced air. The leg portions on the module and the tongue on the chassis form a very rigid coacting connection and as such relieve much of the stress from the pins on the electrical connecting means on the module and therefore provides high vibrational resistance to breakage.

It should be understood of course that in actual practice the module would not necessarily be limited to two boards in one frame, it could be constructed with only one board or with two frames and three boards or some variation thereof. Also there are times when two boards would be hinged instead of one. In some applications the tongue may be on the module and the groove in the chassis, then of course this combination would not necessarily take the shape shown in the drawing. There is the possibility that one board may not be used as a printed circuit board and could find other uses while still being mounted on the module. The module could be other than rectangular in some applications and the grooves would not necessarily be only on the sides of the frame.

While I have shown and described this specific embodiment of this invention, further modifications and improvements will occur to those skilled in the art. I desire to be understood, therefore, that this invention is not limited to the particular form shown and described and I intend in the appended claims to cover all modifications which do not depart from the spirit and scope of this invention.

What I claim is:

1. In an electronic module: heat-conducting frame means, printed circuit means, means pivotally attaching one of said printed circuit means to one side of said frame means, and electrical terminal means connected by pigtail leads to said printed circuit means, said frame means forming a heat transfer means.

2. In an electronic module: a heat-conducting frame, a plurality of printed circuit boards, hinge means attaching one of said boards to one side of said frame, electrical terminal means attached to said frame and connected to said circuit boards, and mechanical connection means incorporated in said heat-conducting frame attaching another of said boards to the other side of said frame, said frame providing heat dissipation for said circuit boards.

3. In an electronic module: a heat conducting frame, said frame having sides and a plurality of outer edges for providing heat dissipation, a plurality of printed circuit boards, means for pivotally attaching one of said boards to one side of said frame, means attaching another of said boards to another side of said frame, electrical connector means, means for attaching said electrical connector means to said frame, electrical means connecting said printed circuit boards and said electrical connector means.

4. In an electronic module: a heat conducting frame, said frame having first and second sides and a plurality of outer edges, a plurality of printed circuit boards, means for attaching one of said boards to one side of said frame, means pivotally attaching another of said boards to the other side of said frame, electrical connector means, means for attaching said electrical connector means to said heat conducting frame and to said printed circuit boards, electrical means connecting said printed circuit boards and said electrical connector means, and channels on at least two of said plurality of outer edges of said frame to provide a mounting means for said module.

5. In an electronic module: a U-shaped heat conducting frame consisting of a bight portion and first and second leg portions, said frame having first and second sides and said leg portions having a plurality of outer edges, a plurality of printed circuit boards, means for rigidly attaching one of said boards to one side of said frame, hinge means pivotally attaching another of said boards to the other side of said frame, electrical connector means, means for attaching said electrical connector means between the ends of said leg portions of said U-shaped frame and to said printed circuit boards to form a substantially rectangular shape, pigtail electrical means connecting said printed circuit board and said electrical connector means, and channels on at least two of said plurality of outer edges of said leg portions of said frame for providing a mounting means for said module.

References Cited in the file of this patent

UNITED STATES PATENTS

| | | |
|---|---|---|
| 2,843,806 | O'Neill | July 15, 1958 |
| 2,849,661 | Oleson | Aug. 26, 1958 |
| 2,864,977 | Witt | Dec. 16, 1958 |
| 2,885,603 | Rose | May 5, 1959 |
| 2,928,555 | Childs | Mar. 15, 1960 |
| 2,952,810 | Helton | Sept. 13, 1960 |
| 2,976,428 | Parkhill | Mar. 21, 1961 |
| 2,984,740 | Madland | May 16, 1961 |
| 3,003,131 | Nystuen | Oct. 3, 1961 |
| 3,088,054 | Myer | Apr. 30, 1963 |

FOREIGN PATENTS

| | | |
|---|---|---|
| 204,940 | Australia | May 12, 1955 |